(12) United States Patent
Lee et al.

(10) Patent No.: US 7,023,095 B2
(45) Date of Patent: Apr. 4, 2006

(54) CARRIER

(75) Inventors: Chun-Yu Lee, Sinying (TW);
Hui-Chang Chen, Kaohsiung (TW)

(73) Assignee: Au Optronics Corp., Hsinchu (TW)

( * ) Notice: Subject to any disclaimer, the term of this patent is extended or adjusted under 35 U.S.C. 154(b) by 36 days.

(21) Appl. No.: 10/921,799

(22) Filed: Aug. 20, 2004

(65) Prior Publication Data
US 2005/0167853 A1 Aug. 4, 2005

(30) Foreign Application Priority Data
Jan. 30, 2004 (TW) .............................. 93102249 A

(51) Int. Cl.
*H01L 23/48* (2006.01)
(52) U.S. Cl. ..................... 257/774; 257/773; 257/775
(58) Field of Classification Search ................ 257/667, 257/669, 673, 735, 773, 774, 775
See application file for complete search history.

(56) References Cited

U.S. PATENT DOCUMENTS

| 5,628,852 A | 5/1997 | Ishida |
| 2003/0155656 A1* | 8/2003 | Chiu et al. ................. 257/774 |

* cited by examiner

*Primary Examiner*—Ngân V. Ngô
(74) *Attorney, Agent, or Firm*—Rabin & Berdo, PC

(57) ABSTRACT

A carrier is provided. The carrier is bonded with a substrate having a number of contact pads through an anisotropic conductive film by thermocompression. The carrier includes a base and a number of leads, wherein the base has a base's surface on which a number of indented patterns are disposed. The leads are disposed on the base's surface with their one end, which are electrically connected to the contact pads through the anisotropic conductive film, being alternately arranged with the indented patterns; meanwhile, part of the anisotropic conductive film spread into the indented patterns when the carrier is bonded to the substrate by thermocompression.

16 Claims, 4 Drawing Sheets

CARRIER

This application claims the benefit of Taiwan application Serial No. 93102249, filed Jan. 30, 2004, the subject matter of which is incorporated herein by reference.

BACKGROUND OF THE INVENTION

1. Field of the Invention

The invention relates in general to a carrier, and more particularly to a carrier with alternately arranged leads and indented patterns.

2. Description of the Related Art

Some existing electronic devices use an anisotropic conductive film (ACF) to connect elements and main body circuits. For example, the drive chip is electrically connected to the liquid crystal display panel (LCD panel) via an anisotropic conductive film. Of which, the anisotropic conductive film is a mixture of non-conductive synthetic resin and conductive particles, wherein the central part of a conductive particle is a polymer coated with a metallic layer such as gold, nickel or tin. The anisotropic conductive film is often used in the manufacturing process of a liquid crystal display, while the technology bonding the drive chip and the LCD panel at least includes the chip on glass (COG) technology and the chip on film (COF) or Tape Automatic Bonding (TAB) technology. The COG technology directly bonds the drive chip on the panel via an anisotropic conductive film (ACF). The COF/TAB technology bonds the drive chips onto a carrier first, and has the carrier with drive chip be bonded with a glass substrate via an anisotropic conductive film afterwards.

Referring to FIG. 1A to 1B, two cross-sectional views of a conventional semiconductor structure manufactured using chip on film technology. In FIG. 1A to 1B, semiconductor structure 10 includes a substrate 11, a carrier 12, a chip 16, an underfill material 17 and an anisotropic conductive film 18. The substrate 11 includes a substrate's surface 11a, which has a number of contact pads 13. The carrier 12 includes a polyimide film (PI film) 14 and a number of leads 15, wherein the polyimide film 14 has a film's surface 14a on which these leads 15 are alternately disposed. Referring to FIG. 1C, the chip 16 disposed on the film's surface 14a has a number of gold bumps 16a, wherein these gold bumps 16a are electrically connected to one end of these leads 15 via thermal compressing of Inner Lead Bonding (ILB) technology. The underfill material 17 is used for covering the joint of the chip 16 and the carrier 12. The anisotropic conductive film 18 which connects part of the substrate's surface 11a and part of the film's surface 14a has a number of conductive particles 18a, wherein part of these conductive particles 18a are for electrically connecting the other end of these leads 15 and these contact pads 13.

In COF manufacturing process, the expansion and contraction of materials as well as the intensity of bonding are commonly encountered problems. Material expansion and contraction will result in boning deviation between the leads 15 and the contact pads 13, leading to insufficient conductive impedance due to insufficient contact area or leading to electric short-circuits due to too small a pitch between two adjacent leads. To increase the conductive impedance between the lead 15 and the contact pad 13, a conventional practice is to let W1, the width of the contact pad 13, be larger than W2, the width of the lead 15, as shown in FIG. 1B, so that the biased positioning problem caused by material expansion and contraction can be resolved. Nevertheless, the pitch between two adjacent contact pads 13 is reduced accordingly.

When the carrier 12 and the substrate 11 are hot sealed, the anisotropic conductive film 18 will be softened under high temperature and high pressure, thereby overflowing on the substrate's surface 11a as shown in FIG. 1D. Meanwhile, part of the conductive particles 18a will spread over the substrate's surface 11a and gather at the interval between two adjacent contact pads 13. Consequently, two adjacent contact pads 13 are more likely to be electrically connected resulting in electric short-circuits as shown in FIG. 1B.

SUMMARY OF THE INVENTION

It is therefore an object of the invention to provide a carrier whose design of having indented patterns and leads be alternately arranged prevents the conductive particles of the anisotropic conductive film from gathering at the contact pad of the substrate, avoiding electric short-circuits and enhancing the adhesion on the carrier and the substrate applied by the anisotropic conductive film.

It is an object of the invention to provide a carrier, which is bonded with a substrate having a number of contact pads through an anisotropic conductive film to by thermocompression. The carrier includes a number of leads and a base's surface on which a number of indented patterns are disposed. The leads are disposed on the base's surface with their one end, which are electrically connected to the contact pads through the anisotropic conductive film, being alternately arranged with the indented patterns; meanwhile, part of the anisotropic conductive film spread into the indented patterns when the carrier is bond with the substrate by thermocompression.

It is another object of the invention to provide a semiconductor structure including a substrate, a carrier and an anisotropic conductive film. The substrate has a substrate's surface, which has a number of contact pads. The carrier includes a number of leads and a base's surface on which a number of indented patterns are disposed. The leads are disposed on the base's surface with their one end, which are electrically connected to the contact pads through the anisotropic conductive film, being alternately arranged with the indented patterns. Part of the anisotropic conductive film spread into the indented patterns when the carrier is bonded with the substrate by thermocompression.

Other objects, features, and advantages of the invention will become apparent from the following detailed description of the preferred but non-limiting embodiments. The following description is made with reference to the accompanying drawings.

DETAILED DESCRIPTION OF THE INVENTION

Embodiment One

Figure 1A:
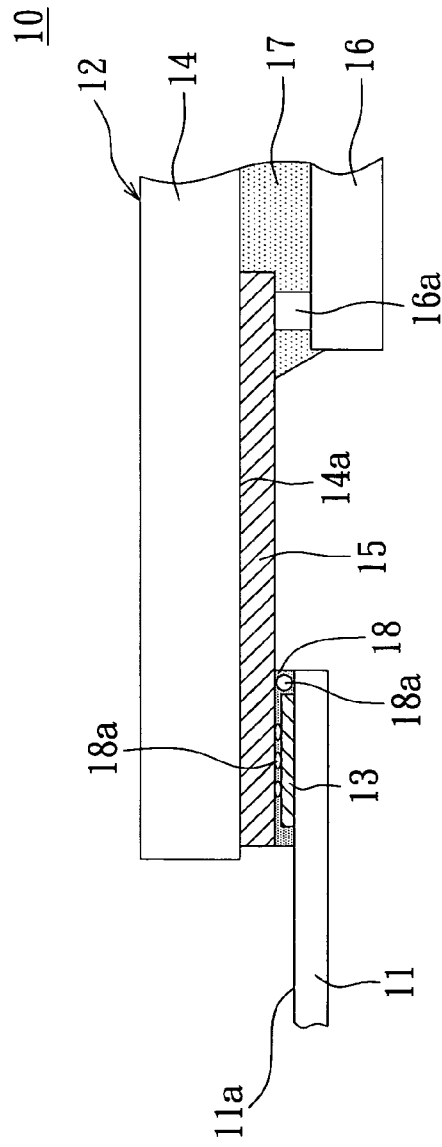
FIG. 1A to FIG. 1B are two cross-sectional views of a conventional semiconductor structure manufactured using chip on film technology.
Figure 1B:
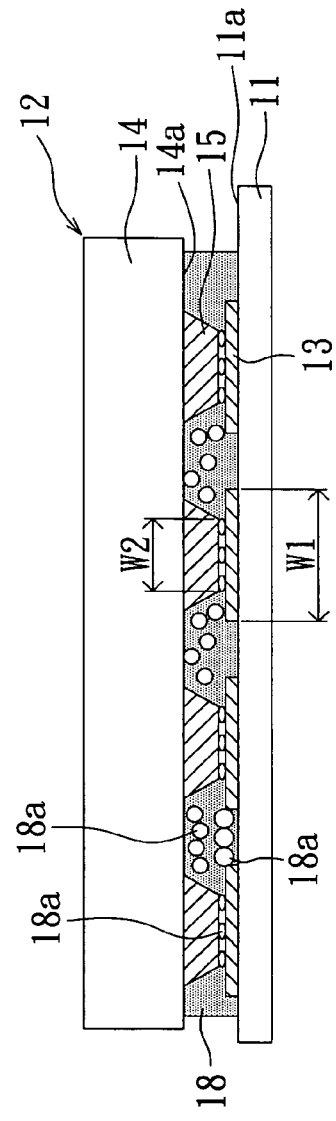
Figure 1C:
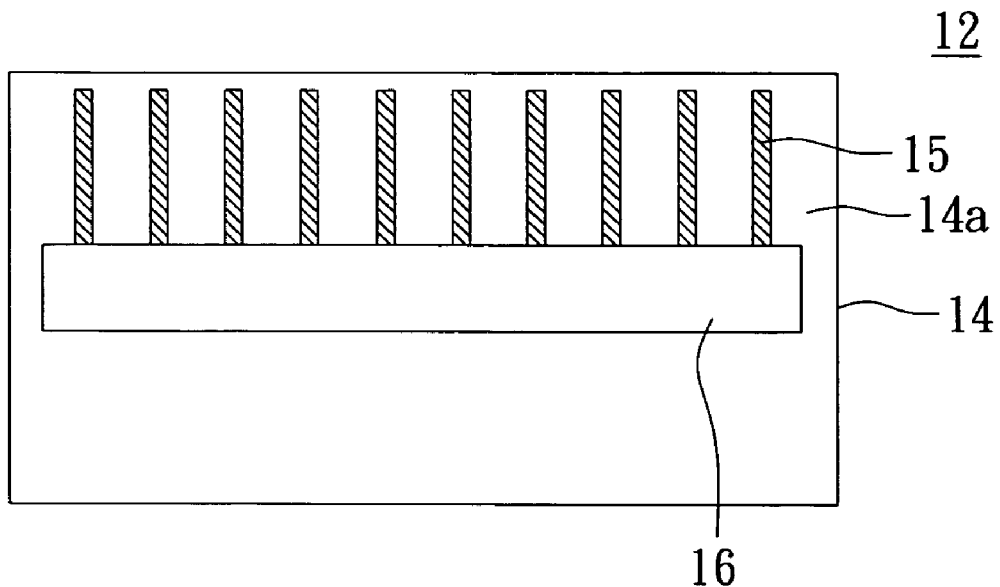
FIG. 1C is a reduced bottom view of the carrier and chip in FIG. 1A.
Figure 1D:
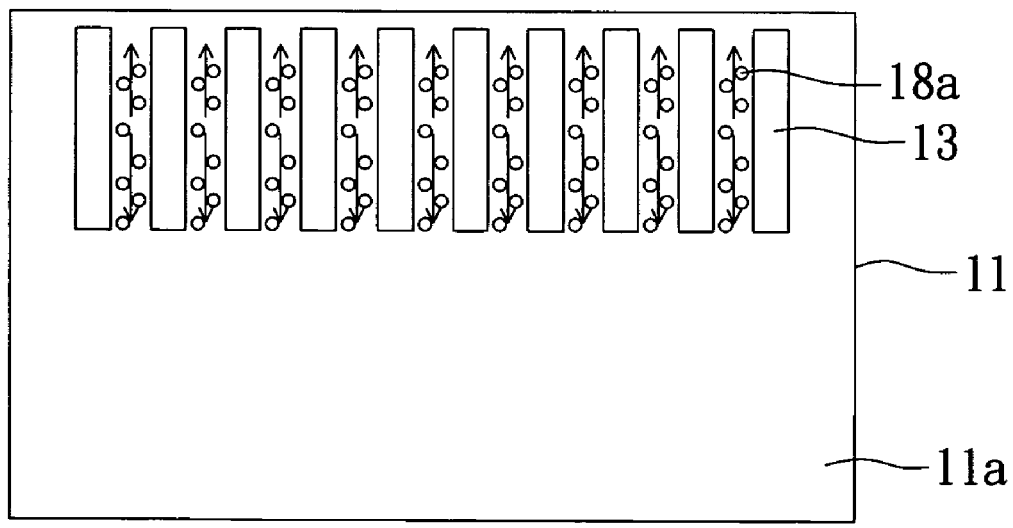
FIG. 1D is a reduced top view of the conductive particles of FIG. 1B overflowing the substrate's surface.
Figure 2:
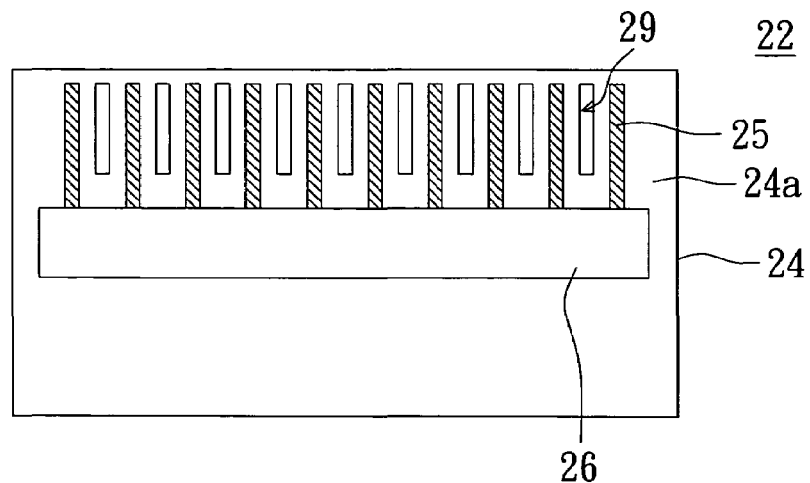
FIG. 2 is a top view of a carrier according to embodiment one of the invention.

Referring to FIG. 2, a top view of a carrier according to embodiment one of the invention. In FIG. 2, carrier 22 includes at least a base 24 and a number of leads 25. The base 24 has a base's surface 24a on which a number of indented patterns are disposed. Of which, each indented pattern is a trench on the base 24 or a threadlike hole 29 which penetrates the base 24. These leads 25 are disposed on the base's surface 24a and are alternately arranged with these threadlike holes 29. Moreover, a chip 26 is disposed on the base's surface 24a and is electrically connected to another end of these leads 25 via COF/TAB technology. For example, the chip 26 has a number of gold bumps (no shown in FIG. 2) for electrically connecting to the leads 25 via thermal compressing of Inner Lead Bonding (ILB) technology.

Figure 3:
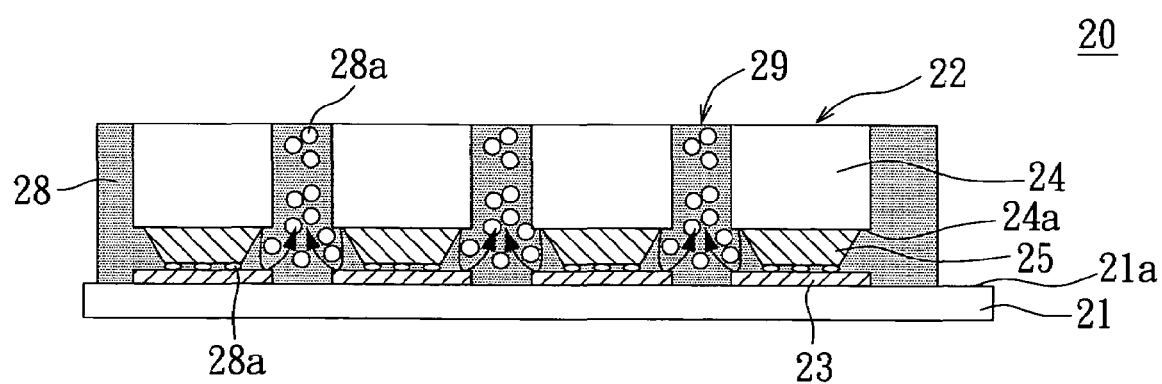
FIG. 3 is a partial enlargement of a semiconductor structure formed by hot sealing the carrier in FIG. 2 with a substrate via an anisotropic conductive film.

As illustrated in FIG. 3, when the carrier 22 forms a semiconductor structure 20 by hot sealing an anisotropic conductive film (ACF) 28 with a substrate 21, the anisotropic conductive film 28 is adhered to part of a substrate's surface 21a and part of the base's surface 24a. The anisotropic conductive film 28 has a number of conductive particles 28a, wherein part of these conductive particles 28a are for electrically connecting these leads 25 with a number of contact pads 23 on the substrate's surface 21a, so that the chip 26 is electrically connected with the substrate 21. Since the carrier 22 has a threadlike hole 29 to which part of the anisotropic conductive film 28 will flow under high temperatures and high pressures, making it easier for these conductive particles 28a to gather at the threadlike hole 29. This prevents these conductive particles 28a from gathering at the interval between two adjacent contact pads 23, thereby reducing the probability of electrical connection between two adjacent contact pads 23 and avoiding the occurrence of electric short-circuits. Besides, the contact area between the anisotropic conductive film 28 and the surface of the carrier 22 will be increased, so the adhesion on the carrier 22 and the substrate 21 applied by the anisotropic conductive film 28 will be enhanced.

Embodiment Two

Figure 4:
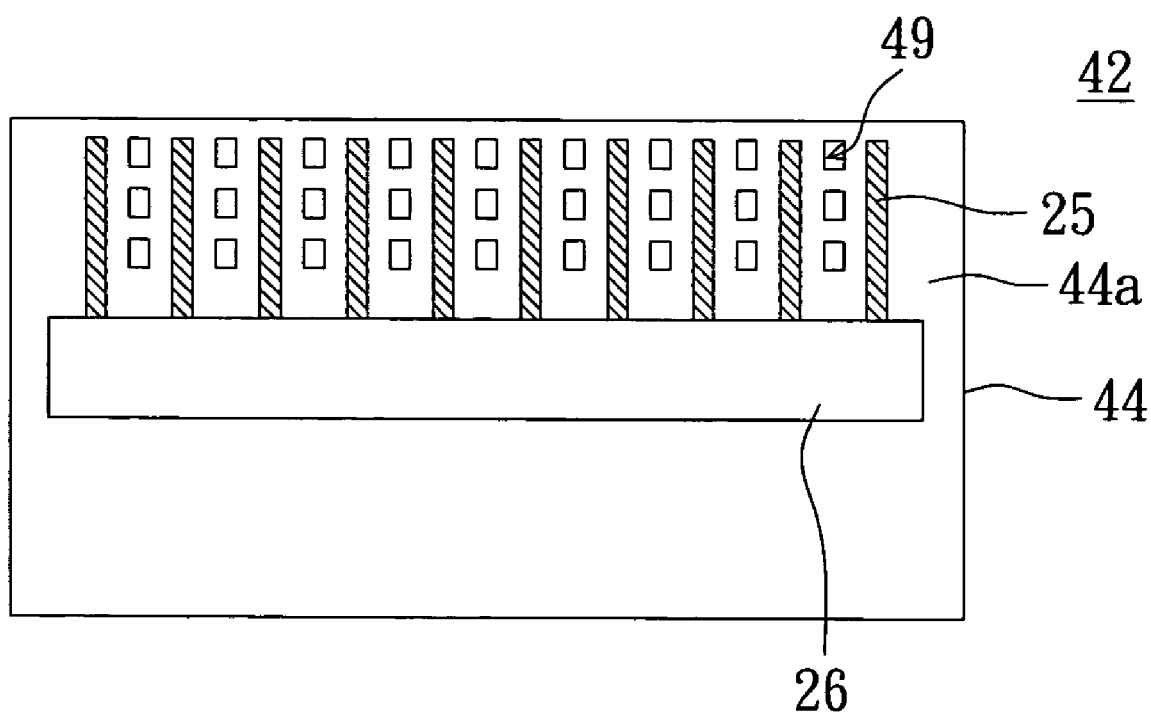
FIG. 4 is a top view of a carrier according to embodiment two of the invention.

Referring to FIG. 4, a top view of a carrier according to embodiment two of the invention. In FIG. 4, carrier 42 in the present preferred embodiment differs from the carrier 22 in embodiment one in the structure of the base and the design of the indented patterns; the remaining part which are the same with each other and follow the same numbering system are not repeated here. In FIG. 4, carrier 42 has a base 44, wherein the base 44 has a base's surface 44a on which a number of indented patterns alternately arranged with these leads 25 are disposed. Of which, each indented pattern includes a number of trenches on the base 44 or a number of vias 49 which penetrate the base 44. The carrier 42 forms a semiconductor structure by hot sealing an anisotropic conductive film and a substrate, wherein the cross-sectional structure of the semiconductor structure is the same with that in FIG. 3 and is not repeated here. Similarly, the design of the run-through hole in the present preferred embodiment reduces the probability of electrical connection between two adjacent contact pads, thereby avoiding the occurrence of electric short-circuits and enhancing the adhesion on the carrier and the substrate applied by the anisotropic conductive film.

However, anyone who is familiar with the technology will understand that the technology of the invention is not limited thereto. For example, the base may be a polyimide (PI) film, wherein the lead is disposed on the base's surface via an adhesive layer. Besides, the substrate may be a glass substrate, while these contact pads are a number of metallic contact pads.

The carrier disclosed in the above preferred embodiment of the invention has a design of having the indented patterns be alternately arranged with the leads, not only prevents the conductive particles of the anisotropic conductive film from gathering at the intervals of contact pads but also avoids the occurrence of electric short-circuits and enhances the adhesion on the carrier and the substrate applied by the anisotropic conductive film.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A carrier, which is bonded with a substrate with a plurality of contact pads through an anisotropic conductive film (ACF) by thermocompression, comprising:
   a base, which has a base's surface on which a plurality of indented patterns are disposed; and
   a plurality of leads disposed on the base's surface with their one end, which are electrically connected to the contact pads through the anisotropic conductive film, being alternately arranged with the indented patterns, wherein part of the anisotropic conductive film spread into the indented patterns when the carrier is bonded with the substrate by thermocompression.

2. The carrier according to claim 1, wherein each of the indented patterns is a trench.

3. The carrier according to claim 1, wherein each of the indented patterns comprises a plurality of cavities.

4. The carrier according to claim 1, wherein each of the indented patterns is a threadlike hole.

5. The carrier according to claim 1, wherein each of the indented patterns comprises a plurality of vias.

6. The carrier according to claim 1, wherein the leads are disposed on the base's surface through an adhesive layer.

7. The carrier according to claim 1, wherein these contact pads are a plurality of metallic contact pads.

8. The carrier according to claim 1, wherein a chip is disposed on the base's surface for electrically connecting to another end of the leads.

9. A semiconductor structure, comprising:
   a substrate, which has a substrate's surface on which a plurality of contact pads are disposed;
   a carrier comprising:
      a base which has a base's surface on which a plurality of indented patterns are disposed; and
      a plurality of leads which are disposed on the base's surface with their one end being alternately arranged with the indented patterns; and
   an anisotropic conductive film, which adheres part of the substrate's surface and part of the base's surface, for electrically connecting one end of these leads with these contact pads, wherein part of the anisotropic conductive film spreads into the indented patterns when the carrier is hot sealed with the substrate.

10. The semiconductor structure according to claim 9, wherein each of these indented patterns is a trench.

11. The semiconductor structure according to claim 9, wherein each of the indented patterns comprises a plurality of cavities.

12. The semiconductor structure according to claim 9, wherein each of the indented patterns is a threadlike hole.

13. The semiconductor structure according to claim 9, wherein each of the indented patterns comprises a plurality of vias.

14. The semiconductor structure according to claim 9, wherein the leads are disposed on the base's surface through an adhesive layer.

15. The semiconductor structure according to claim 9, wherein the contact pads are a plurality of metallic contact pads.

16. The semiconductor structure according to claim 9, wherein a chip is disposed on the base's surface for electrically connecting to another end of the leads.

* * * * *